(12) United States Patent
Yang et al.

(10) Patent No.: US 12,063,042 B2
(45) Date of Patent: Aug. 13, 2024

(54) DUTY CYCLE CORRECTION DEVICE AND METHOD

(71) Applicant: SK hynix Inc., Gyeonggi-do (KR)

(72) Inventors: Dae Ho Yang, Gyeonggi-do (KR);
Kwan Su Shon, Gyeonggi-do (KR);
Jong Hun Lim, Gyeonggi-do (KR);
Jun Seo Jang, Gyeonggi-do (KR); Yo Han Jeong, Gyeonggi-do (KR);
Jaehyeong Hong, Gyeonggi-do (KR);
Byung Joo Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/945,249

(22) Filed: Sep. 15, 2022

(65) Prior Publication Data

US 2023/0115436 A1    Apr. 13, 2023

(30) Foreign Application Priority Data

Oct. 7, 2021   (KR) .......................... 10-2021-0132969
May 24, 2022   (KR) .......................... 10-2022-0063484

(51) Int. Cl.
*H03K 5/156*   (2006.01)
*H03K 5/135*   (2006.01)

(52) U.S. Cl.
CPC ........... *H03K 5/1565* (2013.01); *H03K 5/135* (2013.01)

(58) Field of Classification Search
None
See application file for complete search history.

(56) References Cited

U.S. PATENT DOCUMENTS

| 9,805,773 | B1 | 10/2017 | Shi et al. | |
|---|---|---|---|---|
| 11,509,297 | B2 * | 11/2022 | Lee | ...................... H03K 5/1565 |
| 2021/0409007 | A1 * | 12/2021 | Moslehi Bajestan | ........................ H03K 5/00006 |

FOREIGN PATENT DOCUMENTS

| KR | 10-2015-0142852 A | 12/2015 |
|---|---|---|
| KR | 10-2018-0026957 A | 3/2018 |

* cited by examiner

*Primary Examiner* — Cassandra F Cox
(74) *Attorney, Agent, or Firm* — IP & T GROUP LLP (57) ABSTRACT

A duty cycle correction device includes a duty cycle correction circuit and a duty cycle control circuit. The duty cycle correction circuit corrects a duty cycle of an input dock signal based on a duty cycle control signal and a duty cycle resolution control signal to generate an output dock signal. The duty cycle control circuit generates the duty cycle control signal by detecting a duty cycle of the output clock signal, generates a duty cycle correction completion signal when duty cycle correction is completed, and recorrects the duty cycle of the input clock signal by activating the duty cycle resolution control signal when the duty cycle correction completion signal is activated at an earlier timing than a reference time.

20 Claims, 5 Drawing Sheets

DUTY CYCLE CORRECTION DEVICE AND METHOD

CROSS-REFERENCES TO RELATED APPLICATION

The present application claims priority under 35 U.S.C. § 119(a) to Korean Patent Application Number 10-2021-0132969, filed on Oct. 7, 2021, and Korean Patent Application Number 10-2022-0063484, filed on May 24, 2022, which are incorporated herein by reference in its entirety.

BACKGROUND

1. Technical Field

Various embodiments of the present disclosure may generally relate to integrated circuit technology, and more particularly, to a duty cycle correction device and method, and a semiconductor apparatus using the same.

2. Related Art

Electronic devices may include many electronic elements and a computer system among the electronic devices may include many semiconductor devices configured of semiconductor elements. The semiconductor devices constituting the computer system may transmit and receive a clock signal and data there between to communicate with each other. The semiconductor devices may transmit data to other semiconductor devices or receive data transmitted from other semiconductor devices, in synchronization with the clock signal.

The semiconductor devices may synchronize timing between the clock signal and the data through an internal circuit, but a phase between the clock signal and the data may be changed according to process variation and skew of a transistor. When the phase between the clock signal and the data is changed, a data valid window or a duration may be reduced, and thus accurate data communication of the semiconductor devices may be difficult. Accordingly, the semiconductor devices may include duty cycle correction circuits to compensate for phase skew between the data and the clock signal.

SUMMARY

In an embodiment of the present disclosure, a duty cycle correction device may include: a duty cycle correction circuit configured to receive an input clock signal and correct based on a duty cycle control signal and a duty cycle resolution control signal, a duty cycle of the input clock signal to generate an output clock signal, wherein the duty cycle of the input clock signal is corrected by changing a resolution based on the duty cycle resolution control signal; and a duty cycle control circuit configured to detect the duty cycle of the output clock signal to generate the duty cycle control signal, generate a duty cycle correction completion signal when duty cycle correction for the input clock signal is completed, and activate the duty cycle resolution control signal when the duty cycle correction completion signal is activated at a timing earlier than a reference time.

In an embodiment of the present disclosure, a duty cycle correction device may include: a duty cycle correction circuit configured to receive an input clock signal and correct based on a duty cycle control signal and a duty cycle resolution control signal, a duty cycle of the input clock signal to generate an output clock signal, wherein the duty cycle of the input clock signal is corrected by changing a resolution for duty cycle correction of the input clock signal based on the duty cycle resolution control signal; and a duty cycle control circuit configured to count the input clock signal and activate the duty cycle resolution control signal when a count value of the input clock signal is smaller than a threshold value in a state that a duty cycle correction completion signal is activated.

In an embodiment of the present disclosure, a duty cycle correction device may include: a first variable driver configured to drive an input clock signal based on a duty cycle control signal and correct a duty cycle of the input clock signal to output an output clock signal to an output node; a second variable driver including a first PMOS transistor of which the input clock signal is input to a gate terminal and a power voltage is applied to a source terminal, a second PMOS transistor of which a complementary duty cycle resolution control signal is input to a gate terminal, a source terminal is coupled to a drain terminal of the first PMOS transistor, and a drain terminal is coupled to the output node, a first NMOS transistor of which a duty cycle resolution control signal is input to a gate terminal and a drain terminal is coupled to the output node, and a second NMOS transistor of which the input clock signal is input to a gate terminal, a drain terminal is coupled to a source terminal of the first NMOS transistor, and a ground voltage is applied to a source terminal; and a duty cycle control circuit configured to count the input clock signal and activate the duty cycle resolution control signal when a count value of the input clock signal is smaller than a threshold value in a state that a duty cycle correction completion signal is activated.

In an embodiment of the present disclosure, a duty cycle correction method may include: generating a duty cycle detection signal by detecting a duty cycle of an output clock signal; correcting a duty cycle of the input clock signal with a first resolution by changing a duty cycle control signal based on the duty cycle detection signal; activating a duty cycle resolution control signal when a correction operation for the duty cycle of the input clock signal with the first resolution is completed at a timing earlier than a reference time and a duty cycle correction completion signal is activated; and recorrecting the duty cycle of the input clock signal with a second resolution when the duty cycle resolution control signal is activated.

These and other features, aspects, and embodiments are described in more detail below.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present disclosure are described in detail with reference to the accompanying drawings. The drawings are schematic illustrations of various embodiments and intermediate structures. As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

Embodiments of the present disclosure are described herein with reference to cross-section and/or plan illustrations of the embodiments. However, embodiments of the present disclosure should not be construed as limiting the present disclosure. Although a few embodiments of the present disclosure are shown and described, it will be appreciated by those of ordinary skill in the art that changes may be made in these embodiments without departing from the principles and spirit of the present disclosure.

Figure 1:
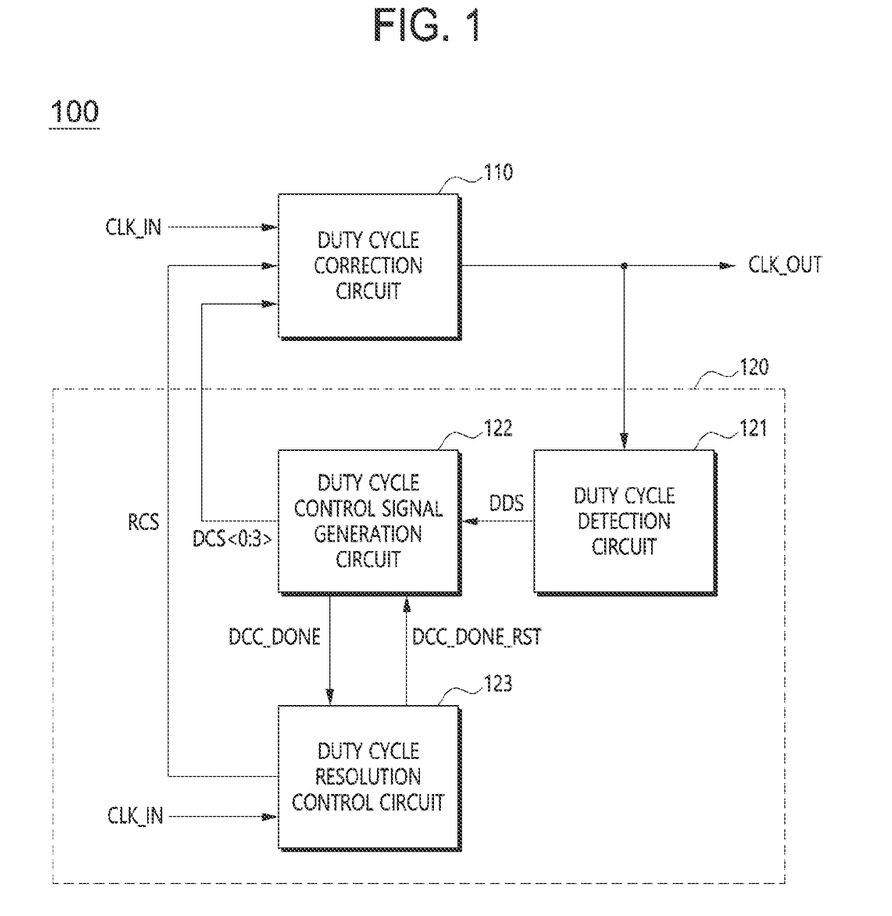
FIG. 1 is a diagram illustrating a configuration of a duty cycle correction device according to an embodiment of the present disclosure.

FIG. 1 is a diagram illustrating a configuration of a duty cycle correction device 100 according to an embodiment of the present disclosure. Referring to FIG. 1, the duty cycle correction device 100 may receive an input clock signal CLK_IN, correct a duty cycle of the input clock signal CLK_IN, and generate an output clock signal CLK_OUT. The input clock signal CLK_IN may be an external clock signal transmitted from an external device of a semiconductor apparatus including the duty cycle correction device 100. The duty cycle correction device 100 may perform a duty cycle correction operation to compensate for change in the duty cycle of the input clock signal CLK_IN.

The duty cycle correction device 100 may receive the input clock signal CLK_IN, count an input clock count of the input clock signal CLK_IN, detect a duty cycle of the output clock signal CLK_OUT to generate a duty cycle detection signal DDS and a duty cycle control signal DCS<0:3>, generate a duty cycle correction completion signal DCC_DONE when the duty cycle correction is completed based on the duty cycle detection signal DDS, and generate a duty cycle resolution control signal RCS based on the duty cycle correction completion signal DCC_DONE and the input clock count of the input clock signal CLK_IN.

The duty cycle correction device 100 may generate the output clock signal CLK_OUT by correcting the duty cycle of the input clock signal CLK_IN with a first resolution when the duty cycle resolution control signal RCS is in an inactivated state, and generate the output clock signal CLK_OUT by correcting the duty cycle of the input clock signal CLK_IN with a second resolution finer than the first resolution when the duty cycle resolution control signal RCS is activated and the input clock count of the input clock signal is smaller than a threshold value.

The duty cycle correction device 100 may include a duty cycle correction circuit 110 and a duty cycle control circuit 120.

The duty cycle correction circuit 110 may receive the input clock signal CLK_IN and correct, based on the duty cycle control signal DCS<0:3> and the duty cycle resolution control signal RCS, the duty cycle of the input clock signal CLK_IN to generate the output clock signal CLK_OUT.

The duty cycle correction circuit 110 may correct the duty cycle of the input clock signal CLK_IN with the first resolution when the duty cycle resolution control signal RCS is in an inactivated state, and re-correct the duty cycle of the input clock signal CLK_IN with the second resolution when the duty cycle resolution control signal RCS is activated. The duty cycle correction circuit 110 may correct the duty cycle of the input clock signal CLK_IN based on a code value of the duty cycle control signal DCS<0:3>, in the duty cycle correction with the first resolution.

For example, a duty cycle of an error-free input clock signal CLK_IN is 50%. When the duty cycle detection signal DDS including information indicating that a low level period of the output clock signal CLK_OUT is larger than a high level period of the output clock signal CLK_OUT is generated from the duty cycle control circuit 120, the duty cycle correction circuit 110 may correct the duty cycle of the input clock signal CLK_IN based on the code value of the duty cycle control signal DCS<0:3> which is increased corresponding to the duty cycle detection signal DDS.

Further, when the duty cycle detection signal DDS including information indicating that the high level period of the output clock signal CLK_OUT is larger than the low level period of the output clock signal CLK_OUT is generated from the duty cycle control circuit 120, the duty cycle correction circuit 110 may correct the duty cycle of the input clock signal CLK_IN based on the code value of the duty cycle control signal DCS<0:3> which is reduced corresponding to the duty cycle detection signal DDS. A duty cycle correction range based on the code value of the duty cycle control signal DCS<0:3> may be set in design of the duty cycle correction device 100.

The duty cycle control circuit 120 may receive the output clock signal CLK_OUT, detect the duty cycle of the output clock signal CLK_OUT to generate the duty cycle detection signal DDS, and generate the duty cycle control signal DCS<0:3> and the duty cycle correction completion signal DCC_DONE based on the duty cycle detection signal DDS.

The duty cycle control circuit 120 may count the input clock count of the input clock signal CLK_IN and activate the duty cycle resolution control signal RCS when the input clock count of the input clock signal CLK_IN is smaller than the threshold value in a state that the duty cycle correction completion signal DCC_DONE is generated.

The duty cycle control circuit 120 may include a duty cycle detection circuit 121, a duty cycle control signal generation circuit 122, and a duty cycle resolution control circuit 123.

The duty cycle detection circuit 121 may receive the output clock signal CLK_OUT, and detect the duty cycle of the output clock signal CLK_OUT to generate the duty cycle detection signal DDS. For example, the duty cycle detection circuit 121 may compare sizes of the low level period and the high level period of the output clock signal CLK_OUT and output a comparison result as the duty cycle detection signal DDS. The duty cycle detection signal DDS may include the information indicating how much the low level period of the output clock signal CLK_OUT is larger than the high level period of the output clock signal CLK_OUT or the information indicating how much the high level period of the output clock signal CLK_OUT is larger than the low level period of the output clock signal CLK_OUT. The duty cycle detection circuit 121 may include a conventional analog integration circuit.

The duty cycle control signal generation circuit 122 may generate the duty cycle control signal DCS<0:3> and the duty cycle correction completion signal DCC_DONE based on the duty cycle detection signal DDS and a correction completion reset signal DCC_DONE_RST. The duty cycle correction completion signal DCC_DONE may be generated when the duty cycle detection signals DDS having different levels from each other are continuously generated from the duty cycle detection circuit 121.

For example, the duty cycle control signal generation circuit 122 may generate the duty cycle correction completion signal DCC_DONE when the duty cycle detection signal DDS having a logic low level is generated and then the duty cycle detection signal DDS having a logic high level is generated, from the duty cycle detection circuit 121, or when the duty cycle detection signal DDS having the logic high level is generated and then the duty cycle detection signal DDS having the logic low level is generated, from the duty cycle detection circuit 121. As will be described later, the correction completion reset signal DCC_DONE_RST may initialize the duty cycle control signal DCS<0:3> when a resolution enable signal RCS_EN_EDGE is activated.

The duty cycle resolution control circuit 123 may receive the input clock signal CLK_IN and the duty cycle correction completion signal DCC_DONE, count the input clock count of the input clock signal CLK_IN, and generate the duty cycle resolution control signal RCS and the correction completion reset signal DCC_DONE_RST based on the input clock count of the input clock signal CLK_IN and the duty cycle correction completion signal DCC_DONE.

For example, the duty cycle resolution control circuit 123 may activate the duty cycle resolution control signal RCS when the duty cycle correction completion signal DCC_DONE is generated at a timing earlier than the set reference time, for example, when the input clock count of the input clock signal CLK_IN is smaller than the threshold value. Further, the duty cycle resolution control circuit 123 may maintain the duty cycle resolution control signal RCS in an inactivated state when the duty cycle correction completion signal DCC_DONE is not generated at the timing earlier than the set reference time, for example, when the input clock count of the input clock signal CLK_IN is larger than the threshold value.

Accordingly, when the duty cycle correction operation is not completed at the timing earlier than the set reference time, the duty cycle resolution control circuit 123 may control the duty cycle correction circuit 110 to terminate the duty cycle correction without an additional duty cycle correction operation. When the duty cycle correction operation is completed at the timing earlier than the set reference time, the duty cycle resolution control circuit 123 may control the duty cycle correction circuit 110 to additionally perform the duty cycle correction operation with a fine duty cycle correction resolution.

Figure 2:
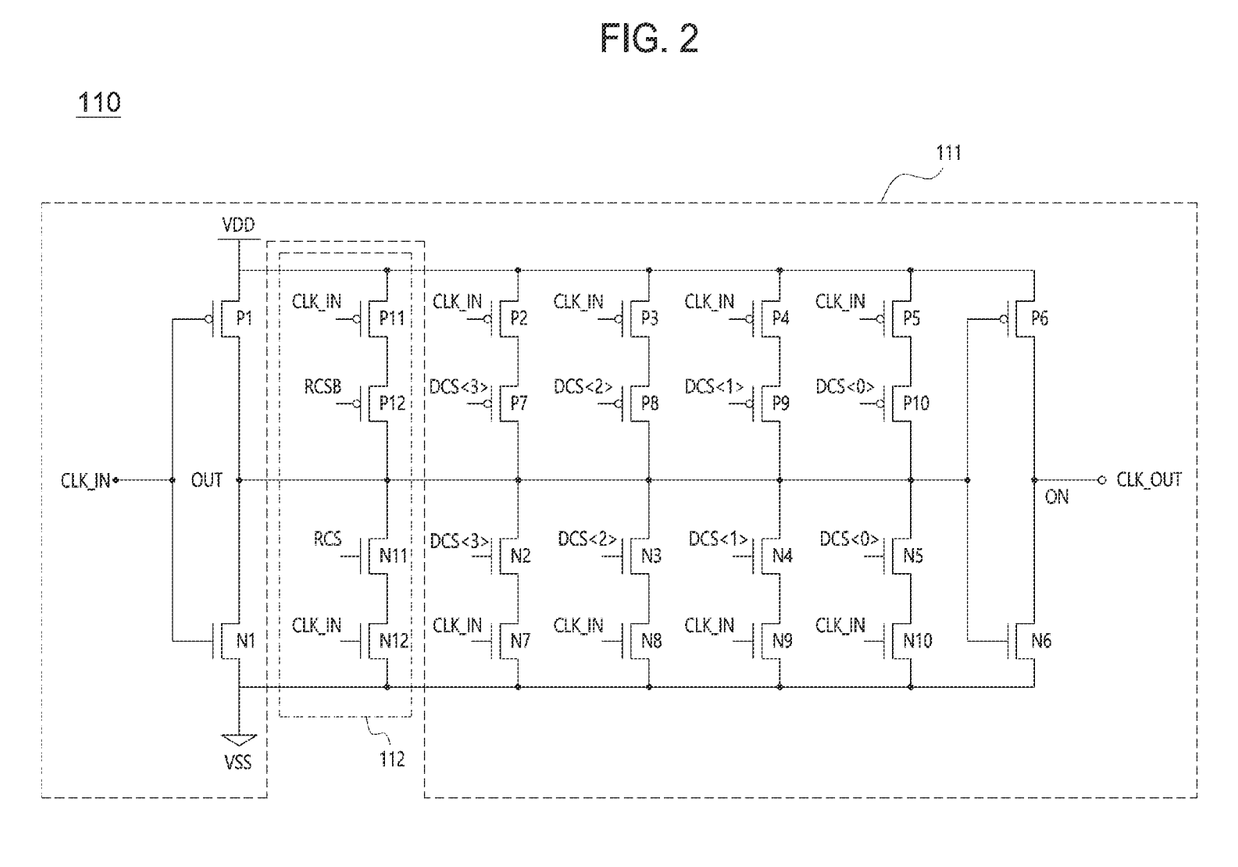
FIG. 2 is a diagram illustrating a configuration of a duty cycle correction circuit illustrated in FIG. 1 according to an embodiment of the present disclosure.

FIG. 2 is a diagram illustrating a configuration of the duty cycle correction circuit 110 illustrated in FIG. 1 according to an embodiment of the present disclosure. As illustrated in FIG. 2, the duty cycle correction circuit 110 may receive the input clock signal CLK_IN, and may perform a pull-up or pull-down operation in response to the input clock signal CLK_IN to generate the output clock signal CLK_OUT through a second output node ON. Specifically, the duty cycle correction circuit 110 may correct the duty cycle of the input clock signal CLK_IN, based on the duty cycle control signal DCS<0:3> and the duty cycle resolution control signal RCS, to generate the output clock signal CLK_OUT through the second output node ON.

A duty cycle correction method through the duty cycle correction circuit 110 will be described blow. Slew rates of a rising edge and a falling edge of the output clock signal CLK_OUT may be controlled according to pull-up drivability and pull-down drivability when the output clock signal CLK_OUT is generated by performing the pull-up and pull-down operation in response to the input clock signal CLK_IN.

For example, when a slew rate of a rising edge in a clock signal is increased and a slew rate of a falling edge in the clock signal is reduced, a high level period of the clock signal may be increased and a low level period of the clock signal may be reduced. When the slew rate of the rising edge in the clock signal is reduced and the slew rate of the falling edge in the clock signal is increased, the high level period of the clock signal may be reduced and the low level period of the clock signal may be increased. When pull-up drivability is increased, the slew rate of the rising edge may be increased, and when the pull-up drivability is reduced, the slew rate of the rising edge may be reduced. When pull-down drivability is increased, the slew rate of the falling edge may be increased, and when the pull-down drivability is reduced, the slew rate of the falling edge may be reduced.

Accordingly, when the pull-up drivability is increased and the pull-down drivability is reduced, the high level period of the output clock signal CLK_OUT may be increased, and when the pull-down drivability is increased and the pull-up drivability is reduced, the low level period of the output clock signal CLK_OUT may be increased. Through the above-described method, the duty cycle correction circuit 110 may correct the duty cycle of the input clock signal CLK_IN to generate the output clock signal CLK_OUT.

The duty cycle correction circuit 110 may include a first variable driver 111 and a second variable driver 112.

The first variable driver 111 may receive the input clock signal CLK_IN, and perform a pull-up and pull-down operation in response to the input clock signal CLK_IN to output the output clock signal CLK_OUT, wherein the first driver 111 may correct, based on the duty cycle control signal DCS<0:3>, the duty cycle of the input clock signal CLK_IN to generate the output clock signal CLK_OUT.

The first variable driver 111 may include a first pull-up/down driver circuit configured to pull-up drive or pull-down drive the first output node OUT in response to the input clock signal CLK_IN, a second pull-up/down driver circuit configured to pull-up drive or pull-down drive the second output node ON in response to a node level of the first output node OUT to output the output clock signal CLK_OUT, and a slew rate control circuit configured to correct the duty cycle of the input clock signal CLK_IN by controlling a slew rate of the out clock signal CLK_OUT based on the duty cycle control signal DCS<0:3>.

The first pull-up/down driver circuit of the first variable driver 111 may receive the input clock signal CLK_IN, and pull-up/down drive the first output node OUT in response to the input clock signal CLK_IN. For example, the first pull-up/down driver circuit may pull-up drive the first output node OUT when the input clock signal CLK_IN is in a logic low level, and pull-down drive the first output node OUT when the input clock signal CLK_IN is in a logic high level.

The second pull-up/down driver circuit of the first variable driver 111 may pull-up/down the second output node ON in response to the node level of the first output node OUT to generate the output clock signal CLK_OUT. For example, the second pull-up/down driver circuit may pull-up drive the second output node ON when the node level of the first output node OUT is in the logic low level, and pull-down drive the second output node ON when the node level of the first output node OUT is in the logic high level.

The slew rate control circuit of the first variable driver 111 may include a first slew rate control circuit configured to control a slew rate of a falling edge of the output clock signal CLK_OUT based on the duty cycle control signal DCS<0:3>, and a second slew rate control circuit configured to control a slew rate of a rising edge of the output clock signal CLK_OUT based on the duty cycle control signal DCS<0:3>.

The first variable driver 111 may include a plurality of PMOS transistors, for example, first to tenth PMOS transistors P1 to P10, and a plurality of NMOS transistors, for example, first to tenth NMOS transistors N1 to N10. The PMOS transistors P1 to P10 and the NMOS transistors N1 to N10 in the first variable driver 111 may have sizes for example, channel widths of the transistors, which are different from each other.

The first pull-up/down driver circuit of the first variable driver 111 may include the first PMOS transistor P1 and the first NMOS transistor N1 which the input clock signal CLK_IN is applied to gates thereof and are coupled between a power voltage VDD terminal and the first output node OUT and between the first output node OUT and a ground voltage VSS terminal, respectively. The second pull-up/down driver circuit of the first variable driver 111 may include the sixth PMOS transistor P6 and the sixth NMOS transistor N6 which the node level of the first out node OUT is applied to gates thereof and are coupled between the power voltage VDD terminal and the second output node ON and between the second output node ON and the ground voltage VSS terminal, respectively.

In the slew rate control circuit of the first variable driver 111, the first slew rate control circuit may include a plurality of PMOS transistor pairs P2 and P7, P3 and P8, P4 and P9, and P5 and P10 which the input clock signal CLK_IN and one of the code values DCS<3>, DCS<2>, DCS<1>, DCS<0> of the duty cycle control signal DCS<0:3> are respectively applied to gates thereof and are coupled in parallel between the power voltage VDD terminal and the first output node OUT. The second slew rate control circuit may include a plurality of NMOS transistor pairs N2 and N7, N3 and N8, N4 and N9, and N5 and N10 which one of the code values DCS<3>, DCS<2>, DCS<1>, DCS<0> of the duty cycle control signal DCS<0:3> and the input clock signal CLK_IN are respectively applied to gates thereof and are coupled in parallel between the first output node OUT and the ground voltage VSS terminal. The numbers of PMOS transistor pairs and NMOS transistor pairs may correspond to the code values of the duty cycle control signal DCS<0:3>.

In the first slew rate control circuit, the seventh to tenth PMOS transistors P7 and P10 may turn on or off in response to the code values DCS<3>, DCS<2>, DCS<1>, DCS<0> of the duty cycle control signal DCS<0:3>, and as the number of PMOS transistors which turn on among the seventh to tenth PMOS transistors P7 to P10 is increased, the slew rate of the falling edge of the output clock signal CLK_OUT may be increased. In the second slew rate control circuit, the seventh to tenth NMOS transistors N7 and N10 may turn on or off in response to the code values DCS<3>, DCS<2>, DCS<1>, DCS<0> of the duty cycle control signal DCS<0:3>, and as the number of NMOS transistors which turn on among the seventh to tenth NMOS transistors N7 to N10 is increased, the slew rate of the rising edge of the output clock signal CLK_OUT may be increased. The first variable driver 111 may correct the duty cycle (for example, duty error) of the input clock signal CLK_IN to generate the output clock signal CLK_OUT, through the above-described control method of controlling the slew rates of the rising edge and the falling edge of the output clock signal CLK_OUT.

The second variable driver 112 may perform an operation which re-corrects the duty cycle of the input clock signal CLK_IN, based on the duty cycle resolution control signal RCS and a complementary signal RCSB of the duty cycle resolution control signal RCS (hereinafter, referred to as "complementary duty cycle resolution control signal RCSB".), with the second resolution finer than the first resolution.

The second variable driver 112 may include eleventh and twelfth PMOS transistors P11 and P12 and eleventh and twelfth NMOS transistors N11 and N12. PMOS transistor pair P11 and P12 may receive the input clock signal CLK_IN and the complementary duty cycle resolution control signal RCSB through gates thereof, respectively, and may be coupled in series between the power voltage VDD terminal and the first output node OUT. NMOS transistor pair N11 and N12 may receive the duty cycle resolution control signal RCS and the input clock signal CLK_IN through gates thereof, respectively, and may be coupled in series between the first output node OUT and the ground voltage VSS terminal.

The second variable driver 112 may turn on or off the twelfth PMOS transistor P12 in response to the complementary duty cycle resolution control signal RCSB to control the slew rate of the falling edge of the output clock signal CLK_OUT, and turn on or off the eleventh NMOS transistor N11 in response to the duty cycle resolution control signal RCS to control the slew rate of the rising edge of the output clock signal CLK_OUT. Accordingly, the second variable driver 112 may additionally correct the duty cycle of the input clock signal CLK_IN with the second resolution to generate the output clock signal CLK_OUT.

Figure 3:
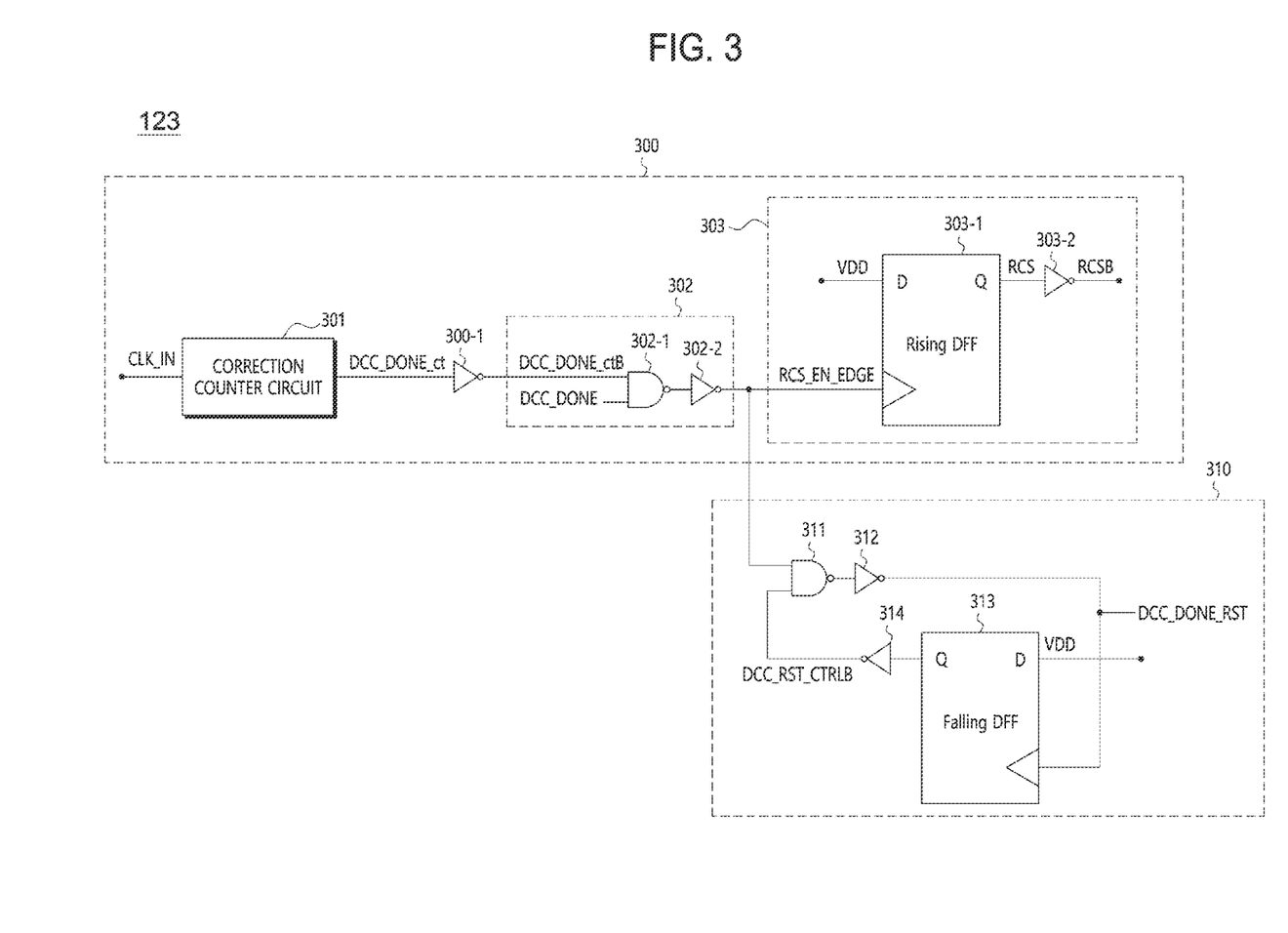
FIG. 3 is a diagram illustrating a configuration of a duty cycle resolution control circuit illustrated in FIG. 1 according to an embodiment of the present disclosure.

FIG. 3 is a diagram illustrating a configuration of the duty cycle resolution control circuit 123 illustrated in FIG. 1 according to an embodiment of the present disclosure. As illustrated in FIG. 3, the duty cycle resolution control circuit 123 may receive the input clock signal CLK_IN and the duty cycle correction completion signal DCC_DONE, count the input clock signal CLK_IN, and generate the duty cycle resolution control signal RCS and the complementary duty cycle resolution control signal RCSB based on the input clock count of the input clock signal CLK_IN and the duty cycle correction completion signal DCC_DONE.

The duty cycle resolution control circuit 123 may activate the duty cycle resolution control signal RCS when the duty cycle correction completion signal DCC_DONE is generated at a timing earlier than the set reference time, for example, when the input clock count of the input clock signal CLK_IN is smaller than the threshold value in a state that the duty cycle correction completion signal DCC_DONE is generated. Further, the duty cycle resolution control circuit 123 may maintain the duty cycle resolution control signal RCS in an inactivated state when the duty cycle correction completion signal DCC_DONE is not generated at the timing earlier than the set reference time, for example, when the input clock count of the input clock signal CLK_IN is equal to or larger than the threshold value in a state that the duty cycle correction completion signal DCC_DONE is generated.

The duty cycle resolution control circuit 123 may include a resolution control signal generation circuit 300 and a reset signal generation circuit 310.

The resolution control signal generation circuit 300 may receive the input clock signal CLK_IN and the duty cycle correction completion signal DCC_DONE, count the input clock count of the input clock signal CLK_IN, and generate the resolution enable signal RCS_EN_EDGE, the duty cycle resolution control signal RCS, and the complementary duty cycle resolution control signal RCSB based on the input clock count of the input clock signal CLK_IN and the duty cycle correction completion signal DCC_DONE.

The resolution control signal generation circuit 300 may include a correction counter circuit 301, a resolution enable signal generation circuit 302, and a resolution control signal output circuit 303.

The correction counter circuit 301 may receive the input clock signal CLK_IN, count the input clock count of the input clock signal CLK_IN, and compare the input clock count with a preset count to generate a duty cycle correction counter signal DCC_DONE_ct. For example, when the input clock count of the input clock signal CLK_IN is smaller than the preset count, the correction counter circuit 301 may output the duty cycle correction counter signal DCC_DONE_ct as a logic low level. When the input clock count of the input clock signal CLK_IN is equal to or larger than the preset count, the correction counter circuit 301 may output the duty cycle correction counter signal DCC_DONE_ct as a logic high level.

The resolution enable signal generation circuit 302 may receive a complementary signal DCC_DONE_ctB of the duty cycle correction counter signal DCC_DONE_ct (hereinafter, referred to as "complementary duty cycle correction counter signal DCC_DONE_ctB"), in which the duty cycle correction counter signal DCC_DONE_ct is inverted through a first inverter 300-1, and the duty cycle correction completion signal DCC_DONE, and generate the resolution enable signal RCS_EN_EDGE.

The resolution enable signal generation circuit 302 may include a first NAND gate 302-1 and a second inverter 302-2. The first NAND gate 302-1 may receive the complementary duty cycle correction counter signal DCC_DONE_ctB and the duty cycle correction completion signal DCC_DONE, and perform a NAND operation on the complementary duty cycle correction counter signal DCC_DONE_ctB and the duty cycle correction completion signal DCC_DONE. The second inverter 302-2 may receive an output signal of the first NAND gate 302-1, invert the output signal of the first NAND gate 302-1, and generate an inverting result as the resolution enable signal RCS_EN_EDGE.

The resolution control signal output circuit 303 may receive the resolution enable signal RCS_EN_EDGE, and generate the duty cycle resolution control signal RCS and the complementary duty cycle resolution control signal RCSB in synchronization with a rising edge of the resolution enable signal RCS_EN_EDGE.

The resolution control signal output circuit 303 may include a first flip flop 303-1 and a third inverter 303-2. The power voltage VDD may be applied to an input terminal D of the first flip flop 303-1 and the resolution enable signal RCS_EN_EDGE may be applied to a clock terminal of the first flip flop 303-1. The first flip flop 303-1 may output the signal input to the input terminal, as an output signal, through an output terminal in synchronization with the resolution enable signal RCS_EN_EDGE. The third inverter 303-2 may receive the duty cycle resolution control signal RCS output from the output terminal of the first flip flop 303-1, invert the duty cycle resolution control signal RCS, and output an inverting result as the complementary duty cycle resolution control signal RCSB.

The reset signal generation circuit 310 may receive the resolution enable signal RCS_EN_EDGE and output the correction completion reset signal DCC_DONE_RST.

The reset signal generation circuit 310 may include a second NAND gate 311, a fourth inverter 312, a second flip flop 313, and a fifth inverter 314. The second NAND gate 311 may receive the resolution enable signal RCS_EN_EDGE and a complementary signal DCC_RST_CTRLB of a duty cycle reset control signal DCC_RST_CTRL (hereinafter, referred to as "complementary duty cycle reset control signal DCC_RST_CTRLB"), and perform a NAND operation on the resolution enable signal RCS_EN_EDGE and the complementary duty cycle reset control signal DCC_RST_CTRLB. The fourth inverter 312 may invert an output signal of the second NAND gate 311 and output an inverting result as the correction completion reset signal DCC_DONE_RST. The power voltage VDD may be applied to an input terminal D of the second flip flop 313 and the correction completion reset signal DCC_DONE_RST may be applied to a clock terminal of the second flip flop 313. The second flip flop 313 may receive the correction completion reset signal DCC_DONE_RST, and may be triggered at a falling edge of the correction completion reset signal DCC_DONE_RST to output the duty cycle reset control signal DCC_RST_CTRL. The fifth inverter 314 may receive an output signal of the second flip flop 313, invert the output signal of the second flip flop 313, and output an inverting result as the complementary duty cycle reset control signal DCC_RST_CTRLB.

The correction completion reset signal DCC_DONE_RST may be transmitted to the duty cycle control signal generation circuit 122 to initialize the duty cycle control signal DCS<0:3>.

Figure 4:
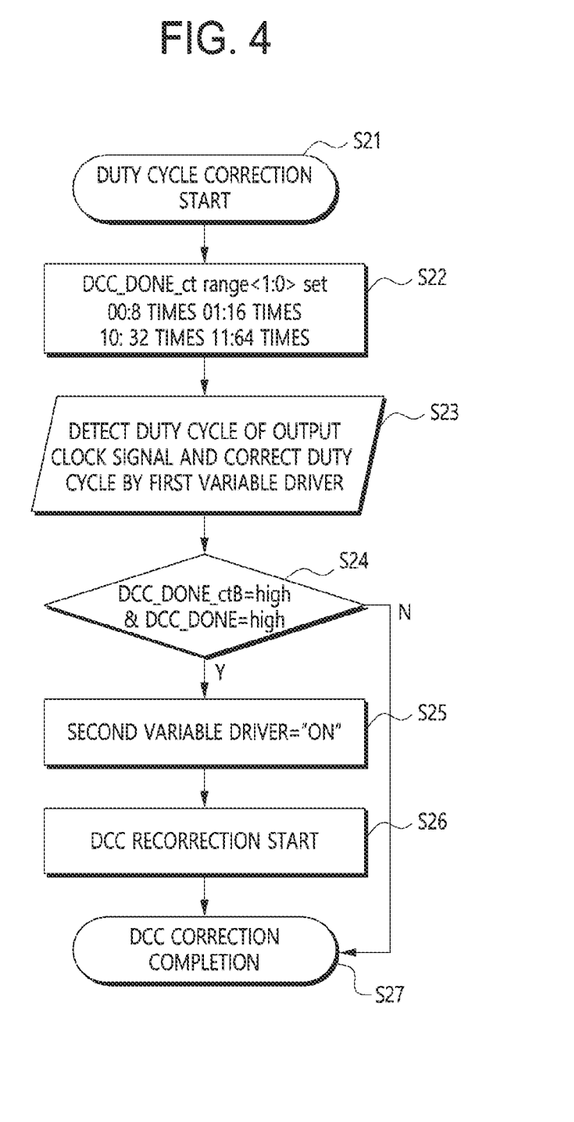
FIG. 4 is a flowchart for describing a duty cycle correction method according to an embodiment of the present disclosure.
Figure 5:
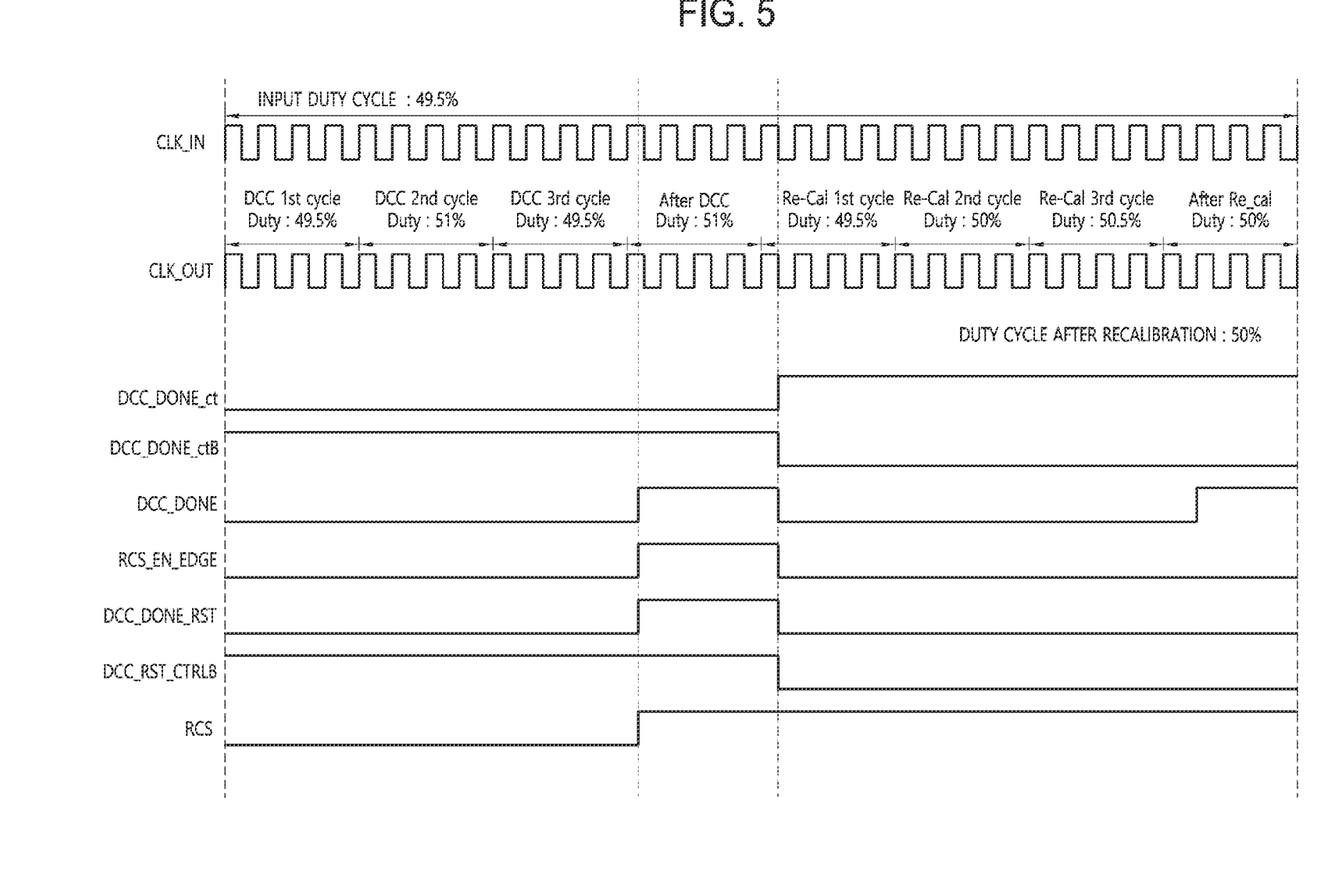
FIG. 5 is a timing diagram illustrating an operation of a duty cycle correction device according to an embodiment of the present disclosure.

FIG. 4 is a flowchart for describing a duty cycle correction method of the duty cycle correction device 100 illustrated in FIG. 1 according to an embodiment of the present disclosure, and FIG. 5 is a timing diagram for describing the duty cycle correction method of the duty cycle correction device 100 according to an embodiment of the present disclosure. Hereinafter, the duty cycle correction operation of the duty cycle correction device 100 will be sequentially described with reference to FIGS. 1 to 5.

Duty cycle correction of the duty cycle correction device 100 may start (S21) and a count number DCC_DONE_CT range<1:0> of a duty cycle correction completion counter (for example, the correction counter circuit 301 of the resolution control signal generation circuit 123), may be set (S22). The count number of the duty cycle correction completion counter may be the same criterion as the reference time for correcting the duty cycle.

The duty cycle correction completion counter may include an option register (not shown) provided in the duty cycle resolution control circuit 123 and may set the count time and count number. The option register may be configured with a flip flop chain.

For example, the duty cycle correction operation will be described based on the count number, for example, the input clock count of the duty cycle correction completion counter is set to 16 when the count number DCC_DONE_CT range<1:0> is set to have a binary value "01", but the input clock count number is not limited thereto and may be variously set as 8, 32, or 64 when the count number DCC_DONE_CT range<1:0> is set to have a binary value "00", "10" or "11", as illustrated in operation S22.

First, the duty cycle correction device 100 may detect the duty cycle of the output clock signal CLK_OUT to generate the duty cycle detection signal DDS, through the duty cycle detection circuit 121 of FIG. 1. The duty cycle correction device 100 may generate the duty cycle control signal DCS<0:3> based on the duty cycle detection signal DDS through the duty cycle control signal generation circuit 122. Then, based on the duty cycle control signal DCS<0:3>, the duty cycle correction device 100 may correct the duty cycle of the input clock signal CLK_IN with the first resolution to generate the output clock signal CLK_OUT, through the first variable driver 111 (S23).

Subsequently, the duty cycle correction device 100 may determine whether or not the input clock count of the input clock signal CLK_IN is smaller than a threshold value (for example, 16) and determine whether or not the duty cycle correction completion signal DCC_DONE is generated from the duty cycle control signal generation circuit 122 (S24).

Specifically, referring to FIG. 5, the duty cycle correction device 100 may receive the input clock signal CLK_IN and count the input clock count of the input clock signal CLK_IN. When the input clock count of the input clock signal CLK_IN is smaller than the threshold value, for example, between 1 from 15, the duty cycle correction device 100 may generate the duty cycle correction counter signal DCC_DONE_ct as a logic low level and the complementary duty cycle correction counter signal DCC_DONE_ctB inverted through the first inverter 300-1 as a logic high level.

Further, the duty cycle correction device 100 may generate the duty cycle correction completion signal DCC_DONE based on the duty cycle detection signal DDS through the duty cycle control signal generation circuit 122. The duty cycle correction device 100 may generate the duty cycle correction completion signal DCC_DONE as the logic high level when the duty cycle correction is completed. Accordingly, in operation S24, the duty cycle correction device 100 may determine whether or not the complementary duty cycle correction counter signal DCC_DONE_ctB is generated as the logic high level in a state that the duty cycle correction completion signal DCC_DONE is generated as the logic high level.

When it is determined that the complementary duty cycle correction counter signal DCC_DONE_ctB is generated as a logic low level in a state that the duty cycle correction completion signal DCC_DONE is generated as the logic high level (S24:N), for example, when it is determined that the duty cycle correction is not completed at a timing earlier than a reference time (S24:N), the duty cycle correction device 100 may generate the resolution enable signal RCS_EN_EDGE and the duty cycle resolution control signal RCS as the logic low level through the duty cycle resolution control circuit 123, and may proceed to operation S27 and complete the duty cycle correction operation without additional duty cycle correction.

When it is determined that the complementary duty cycle correction counter signal DCC_DONE_ctB is generated as a logic high level and the duty cycle correction completion signal DCC_DONE is generated as the logic high level (S24:Y), for example, when it is determined that the duty cycle correction is completed at the timing earlier than the reference time (S24:Y), the duty cycle correction device 100 may generate the resolution enable signal RCS_EN_EDGE, the duty cycle resolution control signal RCS, and the correction completion reset signal DCC_DONE_RST as the logic high level through the duty cycle resolution control circuit 123, and may proceed to operation S25.

The second variable driver 112 of the duty cycle correction circuit 110 in the duty cycle correction device 100 of FIG. 2 may be activated based on the duty cycle resolution control signal RCS (S25) and may re-correct the duty cycle of the input clock signal CLK_IN with a second resolution finer than the first resolution (S26). At this time, the duty cycle control signal DCS<0:3> may be initialized by the correction completion reset signal DCC_DONE_RST.

The above-described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications are apparent in view of the present disclosure and are intended to fall within the scope of the appended claims. Furthermore, the embodiments may be combined to form additional embodiments.

What is claimed is:

1. A duty cycle correction device comprising:
   a duty cycle correction circuit configured to correct a duty cycle of an input clock signal based on a duty cycle control signal to generate an output clock signal, and configured to additionally correct, when a duty cycle resolution control signal is activated, the duty cycle of the input clock signal to generate the output clock signal; and
   a duty cycle control circuit configured to detect a duty cycle of the output clock signal to generate the duty cycle control signal and a duty cycle correction completion signal for the input clock signal and configured to activate the duty cycle resolution control signal when the duty cycle correction completion signal is generated at a timing earlier than a reference time.

2. The duty cycle correction device of claim 1, wherein the duty cycle correction circuit includes:
   a first variable driver configured to perform a pull-up/pull-down operation on the input clock signal, based on the duty cycle control signal; and
   a second variable driver configured to perform a pull-up/pull-down operation on the input clock signal when the duty cycle resolution control signal is activated.

3. The duty cycle correction device of claim 1, wherein the duty cycle control circuit is further configured to maintain the duty cycle resolution control signal in an inactivated state when the duty cycle correction completion signal is not generated at the earlier timing than the reference time.

4. The duty cycle correction device of claim 3, wherein the duty cycle control circuit includes:
   a duty cycle detection circuit configured to detect the duty cycle of the output clock signal to generate the duty cycle detection signal;
   a duty cycle control signal generation circuit configured to generate the duty cycle correction completion signal and the duty cycle control signal based on the duty cycle detection signal; and
   a duty cycle resolution control circuit configured to receive the input clock signal and the duty cycle correction completion signal to generate the duty cycle resolution control signal.

5. The duty cycle correction device of claim 4, wherein the duty cycle control signal generation circuit generates the duty cycle correction completion signal when the correction of the duty cycle of the input clock signal based on the duty cycle control signal is completed.

6. The duty cycle correction device of claim 4, wherein the duty cycle resolution control circuit is further configured to:
   activate the duty cycle resolution control signal when the duty cycle correction completion signal is generated at the timing earlier than the reference time, and
   maintain the duty cycle resolution control signal in an inactivated state when the duty cycle correction completion signal is not generated at the timing earlier than the reference time.

7. A duty cycle correction device comprising:
   a duty cycle correction circuit configured to correct a duty cycle of an input clock signal based on a duty cycle control signal and a duty cycle resolution control signal to generate an output clock signal, wherein the duty cycle correction circuit corrects the duty cycle of the input clock signal based on the duty cycle control signal and re-corrects the duty cycle of the input clock signal based on the duty cycle resolution control signal, and wherein resolutions are different from each other for the correction and the re-correction; and
   a duty cycle control circuit configured to:
   count the input clock signal,
   generate a duty cycle correction completion signal when the correction based on the duty cycle control signal is completed, and
   generate the duty cycle resolution control signal when a count value of the input clock signal is smaller than a threshold value at a timing that the duty cycle correction completion signal is generated.

8. The duty cycle correction device of claim 7,
   wherein the duty cycle correction circuit corrects the duty cycle of the input clock signal by performing a pull-up/pull-down operation on the input clock signal,
   wherein the duty cycle correction circuit corrects the duty cycle of the input clock signal by varying pull-up/pull-down drivability based on a code value of the duty cycle control signal,
   wherein the duty cycle correction circuit re-corrects the duty cycle of the input clock signal by performing a pull-up/pull-down operation on the input clock signal, based on the duty cycle resolution control signal, and
   wherein the resolution for the re-correction is finer than the resolution for the correction.

9. The duty cycle correction device of claim 8, wherein the duty cycle control circuit includes:
   a duty cycle detection circuit configured to detect a duty cycle of the output clock signal to generate a duty cycle detection signal;
   a duty cycle control signal generation circuit configured to receive the duty cycle detection signal, generate the duty cycle control signal of which the code value is changed based on the duty cycle detection signal, and generate the duty cycle correction completion signal when the duty cycle correction is completed; and
   a duty cycle resolution control circuit configured to receive the input clock signal and the duty cycle correction completion signal to generate the duty cycle resolution control signal,
   wherein the duty cycle resolution control circuit is further configured to activate the duty cycle resolution control signal when the duty cycle correction completion signal is generated at a timing earlier than a reference time.

10. A duty cycle correction device comprising:
    a first variable driver configured to correct, based on a duty cycle control signal, a duty cycle of an input clock signal with a first resolution to generate an output clock signal;
    a second variable driver configured to re-correct, based on a duty cycle resolution control signal, the duty cycle of the input clock signal with a second resolution finer than the first resolution to generate the output clock signal; and
    a duty cycle control circuit configured to:
    count the input clock signal,
    generate a duty cycle correction completion signal when the correction is completed, and
    generate the duty cycle resolution control signal when a count value of the input clock signal is smaller than a threshold value at a timing that the duty cycle correction completion signal is generated.

11. The duty cycle correction device of claim 10,
    wherein the first variable driver corrects the duty cycle of the input clock signal, by performing a pull-up/pull-down operation on the input clock signal, to generate the output clock signal, and
    wherein the first variable driver corrects the duty cycle of the input clock signal by changing pull-up/pull-down drivability based on code values of the duty cycle control signal.

12. The duty cycle correction device of claim 11, wherein the first variable driver includes:
    a first pull-up/pull-down driver circuit configured to pull-up drive or pull-down drive a first output node in response to the input clock signal;
    a second pull-up/pull-down driver circuit configured to pull-up drive or pull-down drive a second output node in response to a node level of the first output node to output the output clock signal through the second output node; and
    a slew rate control circuit configured to correct the duty cycle of the input clock signal by controlling a slew rate of the output clock signal based on the code values of the duty cycle control signal.

13. The duty cycle correction device of claim 12, wherein the slew rate control circuit includes:
    a first slew rate control circuit configured to correct the duty cycle of the input clock signal by controlling a slew rate of a falling edge of the output clock signal based on the code values of the duty cycle control signal; and
    a second slew rate control circuit configured to correct the duty cycle of the input clock signal by controlling a slew rate of a rising edge of the output clock signal based on the code values of the duty cycle control signal.

14. The duty cycle correction device of claim 13,
    wherein the first slew rate control circuit includes a plurality of PMOS transistor pairs, of which the input clock signal and one of the code values of the duty cycle control signal are respectively applied to gates, the plurality of PMOS transistor pairs being coupled in parallel between a power voltage terminal and the first output node, and
    wherein the second slew rate control circuit includes a plurality of NMOS transistor pairs, of which one of the code values of the duty cycle control signal and the input clock signal are respectively applied to gates, the plurality of NMOS transistor pairs being coupled in parallel between the first output node and a ground voltage terminal.

15. The duty cycle correction device of claim 11, wherein the second variable driver re-corrects the duty cycle of the input clock signal, by performing a pull-up/pull-down operation on the input clock signal based on the duty cycle resolution control signal, to generate the output clock signal.

16. The duty cycle correction device of claim 15, wherein the second variable driver includes:
   a PMOS transistor pair, of which the input clock signal and a complementary signal of the duty cycle resolution control signal are respectively applied to gates, the PMOS transistor pair being coupled in series between a power voltage terminal and a first output node; and
   a NMOS transistor pair, of which the duty cycle resolution control signal and the input clock signal are respectively applied to gates, the NMOS transistor pair being coupled in series between the first output node and a ground voltage terminal.

17. A duty cycle correction method comprising:
   generating a duty cycle detection signal by detecting a duty cycle of an output clock signal;
   correcting a duty cycle of an input clock signal with a first resolution by changing a duty cycle control signal based on the duty cycle detection signal, to generate the output clock signal;
   generating a duty cycle resolution control signal when the correcting of the duty cycle of the input clock signal with the first resolution is completed at a timing earlier than a reference time; and
   re-correcting the duty cycle of the input clock signal with a second resolution based on the duty cycle resolution control signal, to generate the output clock signal.

18. The method of claim 17, wherein the correcting of the input clock signal with the first resolution includes generating the output clock signal by performing a pull-up/pull-down operation on the input clock signal based on the duty cycle control signal.

19. The method of claim 17, wherein the generating of the duty cycle resolution control signal includes:
   counting the input clock signal; and
   generating the duty cycle resolution control signal when a count value of the input clock signal at a timing that the duty cycle correction completion signal is generated is smaller than a threshold value.

20. The method of claim 17, wherein the re-correcting of the duty cycle includes re-correcting the duty cycle of the input clock signal to generate the output clock signal by performing a pull-up/pull-down operation on the input clock signal with the second resolution finer than the first resolution, based on the duty cycle resolution control signal.

* * * * *